(12) United States Patent
Mawst et al.

(10) Patent No.: US 6,845,116 B2
(45) Date of Patent: Jan. 18, 2005

(54) NARROW LATERAL WAVEGUIDE LASER

(75) Inventors: Luke J. Mawst, Sun Prairie, WI (US);
Nelson Tansu, Madison, WI (US);
Michael P. Nesnidal, Oregon, WI (US);
Steven Meassick, Mt. Horeb, WI (US);
Eric W. Stiers, LaCrosse, WI (US);
Darren M. Hansen, Madison, WI (US);
Troy J. Goodnough, Madison, WI (US)

(73) Assignees: Wisconsin Alumni Research Foundation, Madison, WI (US); The Board of Trustees of the University of Illinois, Urbana, IL (US)

( * ) Notice: Subject to any disclaimer, the term of this patent is extended or adjusted under 35 U.S.C. 154(b) by 94 days.

(21) Appl. No.: 10/279,744

(22) Filed: Oct. 24, 2002

(65) Prior Publication Data

US 2004/0081214 A1 Apr. 29, 2004

(51) Int. Cl.[7] .................................................. H01S 5/00
(52) U.S. Cl. ............................ 372/45; 372/50; 257/13
(58) Field of Search ............................ 372/43, 45, 46, 372/50, 96; 257/13, 14, 15

(56) References Cited

U.S. PATENT DOCUMENTS

| | | | |
|---|---|---|---|
| 4,400,813 A | 8/1983 | Kaminow | 372/45 |
| 4,835,783 A | 5/1989 | Suyama et al. | 372/46 |
| 4,932,032 A | 6/1990 | Koch et al. | 372/45 |
| 5,138,626 A | 8/1992 | Yap | 372/46 |
| 5,272,711 A | 12/1993 | Mawst et al. | 372/45 |
| 5,386,428 A * | 1/1995 | Thornton et al. | 372/50 |
| 5,465,266 A | 11/1995 | Bour et al. | 372/46 |
| 5,706,306 A | 1/1998 | Jiang et al. | 372/96 |
| 5,719,893 A | 2/1998 | Jiang et al. | 372/45 |
| 5,742,631 A * | 4/1998 | Paoli | 372/50 |
| 6,167,073 A | 12/2000 | Botez et al. | 372/46 |
| 6,243,517 B1 * | 6/2001 | Deacon | 385/50 |
| 6,256,330 B1 | 7/2001 | LaComb | 372/46 |
| 6,356,571 B1 | 3/2002 | Kiely et al. | 372/43 |
| 6,363,092 B1 | 3/2002 | Botez et al. | 372/43 |
| 2002/0051615 A1 * | 5/2002 | Walpole et al. | 385/131 |
| 2004/0125846 A1 * | 7/2004 | Zediker et al. | 372/50 |

OTHER PUBLICATIONS

T.L. Koch, et al., "Tapered Wave Guide InGaAs/InGaAsP Multiple Quantum Well Lasers," IEEE Photonics Technology Letters, 1990, pp. 88–90.

Delai Zhou, et al., "Large Spot–Size Narrow Waveguide VCSEL," LEOS Annual Meeting, Nov. 11–15, 2001, LEOS Conference Abstracts, pp. 469–470.

* cited by examiner

*Primary Examiner*—Don Wong
*Assistant Examiner*—Jimmy Vu
(74) *Attorney, Agent, or Firm*—Foley & Lardner LLP

(57) ABSTRACT

As edge-emitting semiconductor laser incorporating a narrow waveguide design is disclosed. The narrow waveguide expands the lateral mode size, creates a large modal spot size, and insures higher-order modes are beyond cutoff. Separate current confinement allows the current injection region to match the mode size. The resulting device exhibits single-mode operation with a large spot-size to high output powers.

25 Claims, 11 Drawing Sheets

1100

NARROW LATERAL WAVEGUIDE LASER

STATEMENT REGARDING GOVERNMENT RIGHTS

This invention was made with United States government support awarded by the following agencies:

NSF 9734283

The United States government has certain rights in this invention.

FIELD OF THE INVENTION

The present invention relates generally to semiconductor laser diodes, including techniques for laterally confining the optical output of semiconductor laser diodes. More particularly, the present invention relates to narrow lateral waveguide lasers and methods of making the same.

BACKGROUND OF THE INVENTION

In general, a semiconductor laser is a diode device in which a forward bias voltage is applied across an active layer, which is surrounded by one or more waveguide layers, which in turn are surrounded by a pair of cladding layers. One cladding layer is an n-doped layer and the other is a p-doped layer so that excess electrons from the n-doped layer and excess holes from the p-doped layer are injected through the wavelength layers and into the active layer by the bias voltage, where they recombine. At current levels above a threshold value, stimulated emission occurs and a monochromatic, highly-directional beam of light is emitted from the active layer. A resonant cavity is formed in the waveguide layers at one end of the device by a highly-reflective surface and at the other end of the device by a partially-reflective surface through which the beam emerges. The cladding layers usually have a lower index of refraction than the active and waveguide layers which transversely confines the laser light to the active and waveguide layers.

One technique to laterally confine the optical output of a semiconductor laser diode for operation at the fundamental lateral mode is gain guiding. Gain guiding utilizes an electrical contact to supply current to the device. This contact defines the lasing region of the device. However, at high power levels, gain-guided laser diodes have strong instabilities and generate broad, highly-astigmatic multi-peaked beams. Further, gain guiding is generally only operable for lateral waveguides having widths in the 100's of microns range.

Another technique for laterally confining the optical output of a semiconductor laser diode is index guiding. Index guiding employs various dielectric waveguide structures to laterally confine the laser light. These waveguide structures are either positive-index guides, in which the index of refraction is higher in the region aligned with the laser element and lower in the regions surrounding the laser element, or negative-index guides, in which the index of refraction is lower in the region aligned with the laser element and higher in the regions surrounding the laser element. Positive-index guiding effectively traps light in the laser element, while negative-index guiding, or antiguiding, allows light to leak out of the lasing element.

Conventional positive-index guided laser diodes have aperture spot sizes on the order of 2 to 3 microns and operate reliably at single-mode power levels of less than 200 mW. Such sizes and power levels can be inadequate for some applications, such as pumping optical amplifiers for long range transmission.

A high optical power density at the output facet of a semiconductor laser negatively affects both the maximum attainable optical power from the laser before the onset of catastrophic optical mirror damage (COMD) and the long-term reliability of the device. A device in which the optical mode is confined to a narrow region will exceed the maximum power density of the output facet at a lower total output power than a device in which the optical mode is distributed over a relatively large area. When devices of both types are operated at the same total output power the higher power density in the device with the narrow optical mode will contribute to greater local facet heating and therefore accelerated facet degradation relative to the device with the wider optical mode, leading to reduced device lifetimes and reliability. Although these considerations suggest that such devices should have the widest possible optical mode, care must also be exercised to ensure that single mode operation is maintained if the device is to be coupled to a single mode fiber. If a laser can support undesirable modes above threshold in addition to the desired mode, coupling inefficiencies and kinked ex-fiber power-current relationships can occur. For such applications, it would be highly desirable to have a laser design that would exhibit properties such as low optical power density and single mode operation in addition to being manufacturable from both a materials growth and processing tolerance perspective.

Several attempts have been made to increase the size of the lateral optical mode (lateral spot size) to lower the optical power density at the output facet. Tapered waveguides attempt to expand the beam at the output facet of the laser thus producing a larger optical mode. See T. L. Koch, U. Koren, G. Eisenstein, M. G. Young, M. Oron, C. R. Giles, B. I. Miller, "Tapered Waveguide InGaAs/InGaAsP Multiple Quantum Well Lasers," IEEE Photonics Technology Letters, 1990, pp. 88–90. However, the techniques required to construct a tapered structure are not easily incorporated into a standard MOCVD regrowth manufacturing process. Broad lateral waveguides may offer potentially low power density modes but may also support higher-order modes at high drive current. ARROW structures can support large lateral single mode. See D. Botez, Iulian Basarab Petrescu-Prahova, Luke J. Mawst, "High Power Laterally Antiguided Semiconductor Light Source with Reduced Transverse Optical Confinement," U.S. Pat. No. 6,167,073, Dec. 26, 2000.

SUMMARY OF THE INVENTION

In accordance with the invention, a semiconductor laser can include at least one quantum well, one or more transverse waveguide layers, a first cladding layer located below the waveguide layers, a lateral guide structure located close to the active region, blocking structures located proximate the lateral guide structure and providing lateral confinement of current to a region surrounding the lateral guide structure, and a second cladding layer located above the lateral guide structure. The lateral guide structure has a first index and the second cladding layer has a second index. The first index is higher than the second index. In accordance with the invention, a narrow lateral waveguide can be used in conjunction with a suitable transverse structure to achieve a low optical power density and single lateral mode operation with a structure that may be easily grown via MOCVD and processed with standard semiconductor techniques. The operation of the narrow lateral waveguide is not dependent on a particular transverse structure, and may be combined with a transverse narrow waveguide, broad waveguide, or other structure which features a large transverse spot size.

The invention may be embodied in a method of forming a semiconductor laser device. The method includes forming an active layer, one or more transverse waveguide layers, and a first cladding layer above a substrate, forming a guide layer above the active layer, patterning the guide layer to form a patterned guide, forming blocking structures that provide lateral current confinement to a region surrounding the patterned guide, and forming a second cladding layer above the patterned guide and blocking structures.

An edge-emitting semiconductor laser in accordance with the invention can include a narrow waveguide design. The laser includes a transverse waveguide core having one or more quantum wells, a lateral waveguide located above the transverse waveguide core and configured to create a narrow-waveguide mode, cladding layers above and below the waveguide core, and blocking structures located proximate the lateral waveguide and configured to confine the current to a region surrounding the lateral waveguide.

Other objects, features and advantages of the invention will become apparent to those skilled in the art upon review of the following drawings, the detailed description, and the appended claims.

DETAILED DESCRIPTION OF EXEMPLARY EMBODIMENTS

Figure 1:
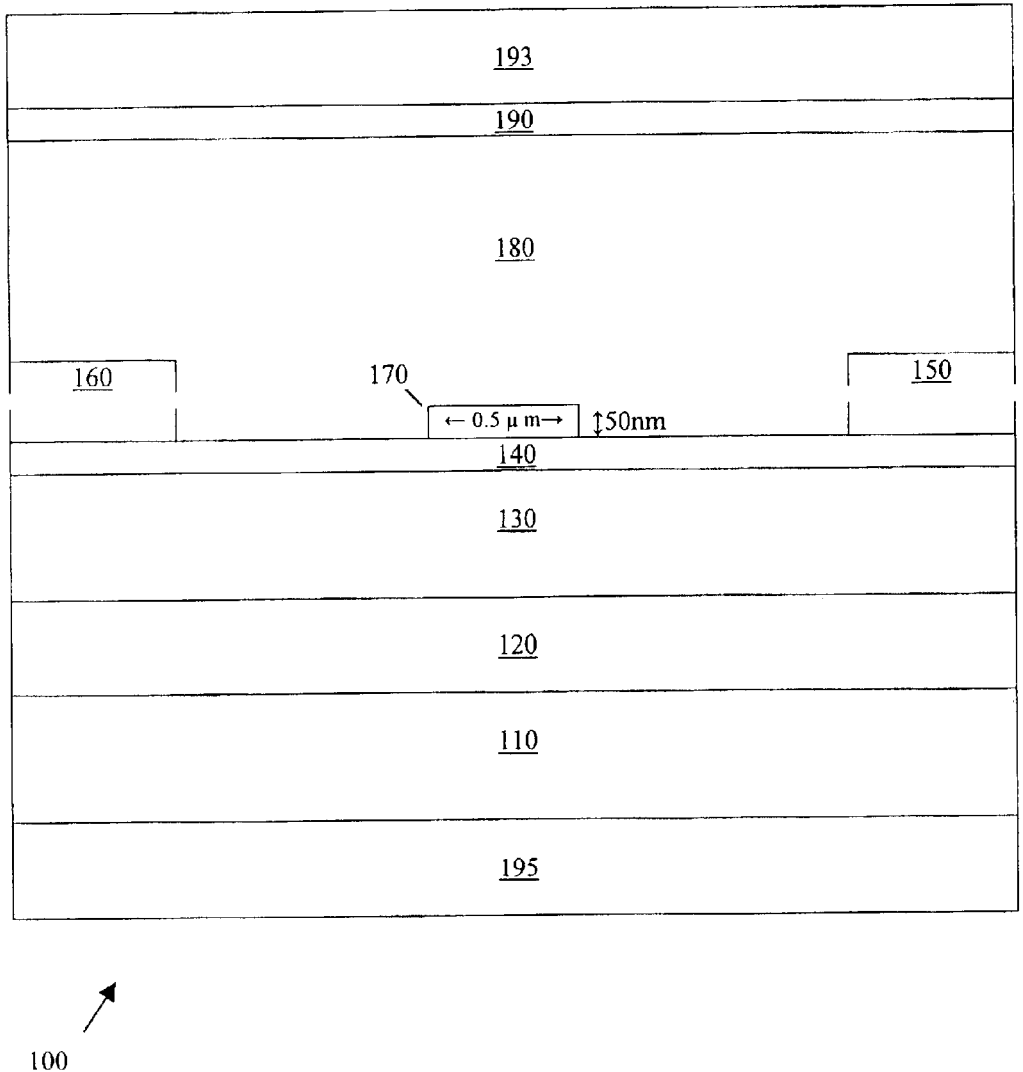
FIG. 1 is a diagrammatic representation of a multi-layer structure of an exemplary device according to an exemplary embodiment.

In the following description, for purposes of explanation, numerous specific details are set forth to provide a thorough understanding of exemplary embodiments of the invention. It will be evident, however, to one skilled in the art that the invention may be practiced without these specific details. In other instances, structures and devices are shown in diagram form to facilitate description of the exemplary embodiments.

Exemplary embodiments of an edge-emitting semiconductor laser incorporating a narrow waveguide design and a method of making the same are disclosed herein. The narrow waveguide expands the lateral mode size, creating a large modal spot size and ensuring higher-order modes are beyond cutoff. Separate current confinement allows the current injection region to match the mode size. The resulting device exhibits single-mode operation with a large spot-size to high output powers.

The laser of the present invention is well suited for coupling to single mode optical fibers, which may be understood by considering devices having waveguides of various widths. When the waveguide is relatively wide, the optical mode will tend to fill the guide and therefore the size of the optical mode will be nearly linearly proportional over some range. As the width of the broad waveguide is reduced, the optical mode size is also reduced until at some point the guide becomes too narrow to contain the mode and the mode shifts to a Lorenzian shape. If the waveguide width is further reduced, the narrow high-index material leads to reduced confinement by the guide and wider Lorenzian modes. It may thus appear that arbitrarily large optical mode sizes could be achieved either with the broad or narrow waveguide approach, several factors impose practical limits. A broad waveguide may support more than one mode, depending on the width of the guide and the index step between the guide and the surrounding material. Thus, for a given index step there is a maximum width allowed for single mode operation. On the other end of the scale, the reduced width of the narrow waveguide will support only one mode, and the limiting factor for the optical mode size becomes the dimension at which the guide stripe can be reliably manufactured, i.e., the critical dimension of the process used to manufacture the laser.

A narrow lateral waveguide that addresses the issues discussed above may be constructed in accordance with the invention by employing a waveguide in which the guide stripe is constructed of a material that has a slightly larger index than the surrounding cladding such that the Larenzian nature of the guided mode will be maintained for a relatively wide stripe. Even with the small index step between the guide and the surrounding material, the effective index step for the guided mode (An) can be much larger (typically ~0.02) than that of a ridge-guide type device (typically ~0.003), so that the optical mode of the narrow lateral waveguide structure remains stable to a higher optical power than that of the ridge guide device in the presence of auxiliary effects which may modify the index of the lasing region, such as high carrier densities or resistive heating of the device materials. Devices with Δn values approaching that of ARROW devices are feasible. The guide stripe can then be manufactured by the same method that ARROW reflectors are produced, i.e., by an etch and re-growth process.

By way of example, FIG. 1 illustrates a semiconductor laser device 100 including multiple layers. The device 100 is an edge-emitting semiconductor laser. The edge facets of the device 100 are not specifically shown in FIG. 1. Edge facets provide confinement of light. Preferably, the layers of the semiconductor laser device 100 are epitaxially grown on a GaAs substrate 110. It is preferred that the top surface of the substrate 110 be the <100> surface and that the epitaxial layers be grown on this surface exactly on orientation.

Device 100 includes a lower cladding layer 120 disposed over the substrate 110. The lower cladding layer 120 can be an InGaAlP layer with a thickness (i.e., thickness in the transverse or vertical direction) of 750 nm. A transverse waveguide 130 is provided above the lower cladding layer 120. The transverse waveguide 130 is an active region that can be an InGaAsP high-index transverse waveguide including quantum well layers, electron confinement layers, or any of a variety of different material layers. Example quantum well layers are described with reference to FIG. 2. The transverse waveguide 130 can have a thickness of, e.g., 960 nm. An etch stop layer 140 can be provided above the transverse waveguide 130. For example, the etch stop layer 140 can be a InGaP etch stop layer with a thickness of 50 nm.

Blocking structures or layers 150 and 160 and a guide material structure 170 are provided above the etch stop layer 140. Guide material structure 170 is a narrow lateral waveguide configured to guide light laterally through the device 100. The blocking structures 150 and 160 are positioned to assist in confinement of current to a lateral region between the layers 150 and 160 that encompasses the guide material structure 170. The blocking structures 150 and 160 can be located in the same plane as the guide material structure 170. Alternatively, the blocking structures 150 and 160 are offset vertically compared to the guide material structure 170. In either case, the blocking structures 150 and 160 should be symmetric about the center of the device as closely as possible to provide a symmetric supply of carriers to the junction, as asymmetric carrier pumping may lead to an asymmetric optical mode.

The blocking structures 150 and 160 can be an n-type material, semi-insulating, composed of alternating PN junction layers or any other current blocking material type. Alternatively, an implanted blocking layer can be used instead of blocking structures 150 and 160 in which dopant atoms are shot into the top of the structure to create an n-type layer or alternatively a resistive layer. In at least one embodiment, blocking structures 150 and 160 are n-type InGaP with a thickness of 250 nm.

An upper cladding layer 180 is located above the blocking structures 150 and 160, the guide material structure 170, and the etch stop layer 140. The upper cladding layer 180 can be a AlGaAs material with a thickness of 1500 nm.

The blocking structures 150 and 160 can be modified by the addition of a small amount of InGaAsP or GaAs as to increase the index of the blocking structures 150 and 160 relative to the upper cladding layer 180. The increase in index has the effect of raising the effective index of the blocking structures 150 and 160 relative to the core region, which counter-acts the tendency of the core region to rise in index due to heating.

The guide material structure 170 can be a GaAs high-index guide with a thickness of 50 nm and a width of 0.5 microns ($\mu$m). The guide material structure 170 is constructed of a material that has a higher index than surrounding cladding layers. For example, the index of the guide material structure 170 can be 3.51 and the index of the lower cladding layer 120 can be 3.01 and the index of the upper cladding layer 180 can be 3.23.

A cap layer 190 is located above the upper cladding layer 180. The cap layer 190 can be a p+ GaAs material layer with a thickness of 100 nm. Metal electrode contact layers 193 and 195 are provided above the cap layer 190 and below the substrate 110, respectively. The metal electrode contact layers 193 and 195 can be annealed in a rapid thermal cycle to insure local interdiffusion of metal from the contact electrode layers 193 and 195 into the cap layer 190 and the substrate 110.

Advantageously, the guide material structure 170 provides a narrow lateral waveguide. A narrow waveguide helps improve containment. Further, the guide material structure 170 has a narrow lateral waveguide design which expands the lateral mode size, creates a large modal spot size, and insures higher-order modes are beyond cutoff. It is, therefore, possible to achieve higher power from the semiconductor laser device 100.

Referring now to FIGS. 2–7, an exemplary method of forming the semiconductor laser device 100 described with reference to FIG. 1 is provided. Other methods of fabrication are also possible. Further, additional or fewer layers may be fabricated as well as combinations of layers. The method described with reference to FIGS. 2–7 is only by way of example for description of exemplary embodiments and not by way of limitation.

Figure 2:
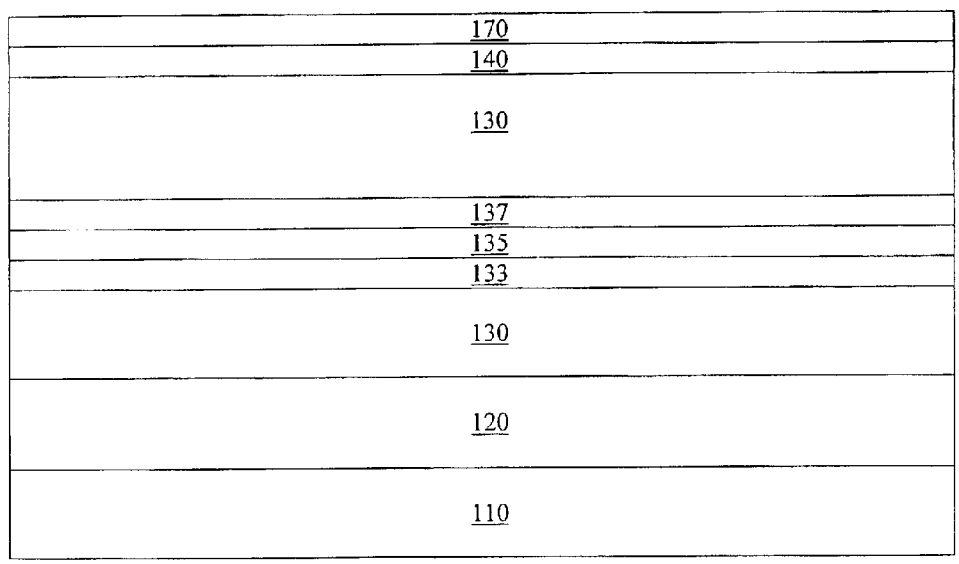
FIG. 2 is a diagrammatic representation of a base growth operation in an exemplary process of fabrication the multi-layer structure of FIG. 1.

FIG. 2 illustrates a layer formation operation in an exemplary fabrication method of the semiconductor laser device 100. Preferably, multiple layers are grown on a GaAs substrate 110. The exemplary layers shown are grown on the GaAs substrate <100> on-axis substrate via metal organic chemical vapor deposition (MOCVD) or another technique. Preferably, the substrate 110 is doped with an n-type dopant.

The low-index cladding layer 120 can be formed above the substrate 110. The low-index cladding layer 120 can be an InGaAlP material layer, doped with an n-type dopant. The low-index cladding layer 120 can have a thickness of 750 nm. Above the low-index cladding layer 120 is the high-index transverse waveguide 130, the etchstop layer 140, and the high-index guide layer 170. Quantum wells 135 and a barrier layers 133 and 137 are included within the high-index transverse waveguide 130.

Various exemplary dimensions can be used in portion 200. For example, the quantum well 135 can have a thickness of 9 nm. The barrier layers 133 and 137 can have a thickness of 10 nm. The high-index transverse waveguide 130 can have a total thickness of 960 nm (including the quantum well 135 and barrier layers 133 and 137). The etch stop layer 140 can be an InGaP layer with a thickness of 50 nm. Preferably, the etch stop layer 140 is doped with a p-type dopant. The high-index guide 270 can be a GaAs layer with a thickness of 50 nm. Preferably, the high-index guide 170 is doped with a p-type dopant. Other dimensions and configurations are also possible.

Figure 3:
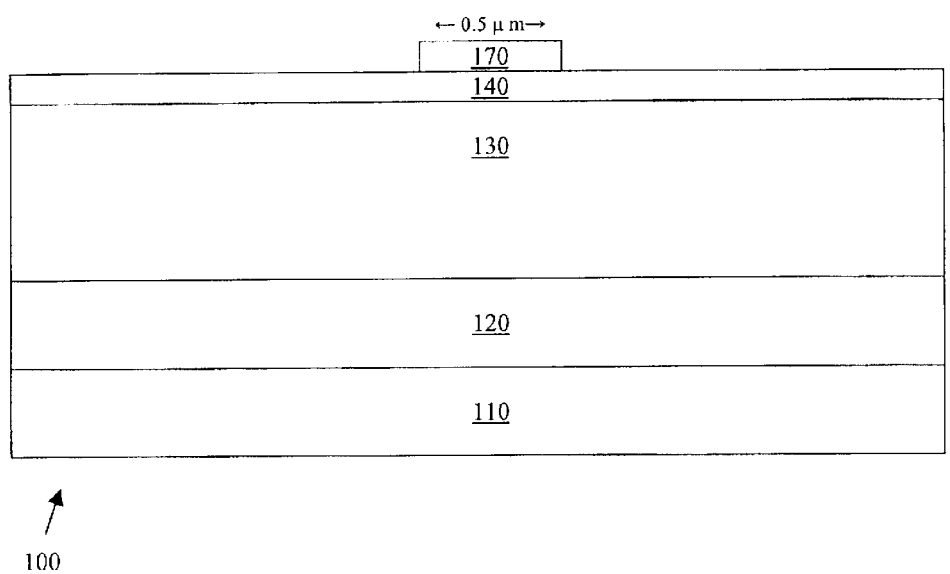
FIG. 3 is a diagrammatic representation of a guide layer patterning operation in an exemplary process of forming the multi-layer structure of FIG. 1.

FIG. 3 illustrates a patterning operation in which the high-index guide layer 170 is patterned. A narrow ridge of the high-index guide layer 170 is patterned by e-beam writing, short-wavelength optical photoresist patterning, or any other means which achieves a narrow (e.g., approximately 0.5 $\mu$m) high-index stripe.

Once the high-index guide layer 170 is patterned, the remainder of the high-index guide layer 170 is removed via chemical etching with an etchant that has a substantially higher etch rate for the material of the high-index guide layer 170 than for the etch stop layer 140.

Figure 4:
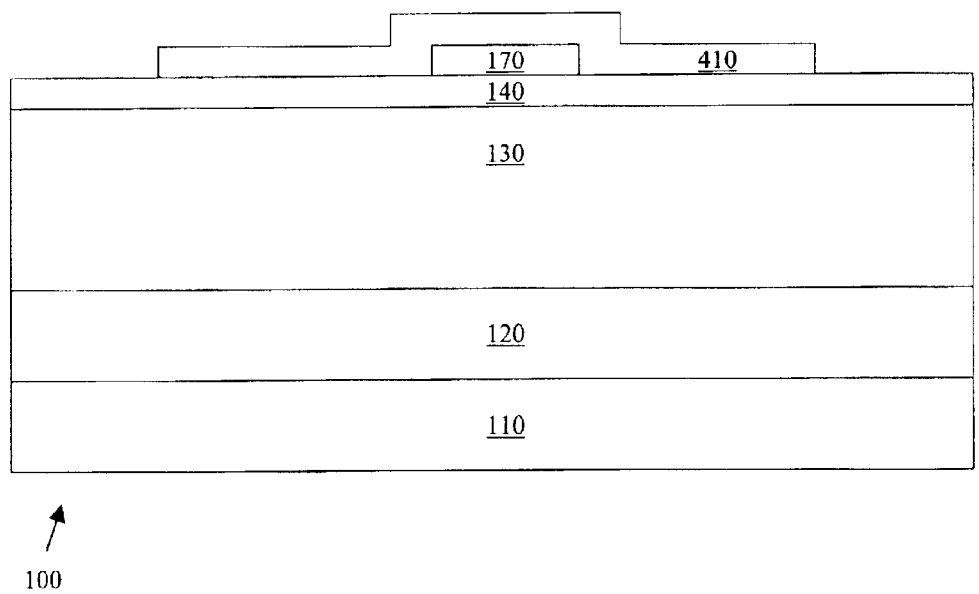
FIG. 4 is a diagrammatic representation of a hardmask formation operation in an exemplary process of forming the multi-layer structure of FIG. 1.

FIG. 4 illustrates a hardmask formation operation in which a hardmask layer 410 is formed. In the situation where a MOCVD-grown layer is used for current confinement, the hardmask layer 410 is deposited, patterned, and etched such that it covers the high-index guide layer 170 and a surrounding region of several microns which are to be pumped with current when the device is operated. An exemplary hardmask material for hardmask layer 410 is $SiO_2$.

Figure 5:
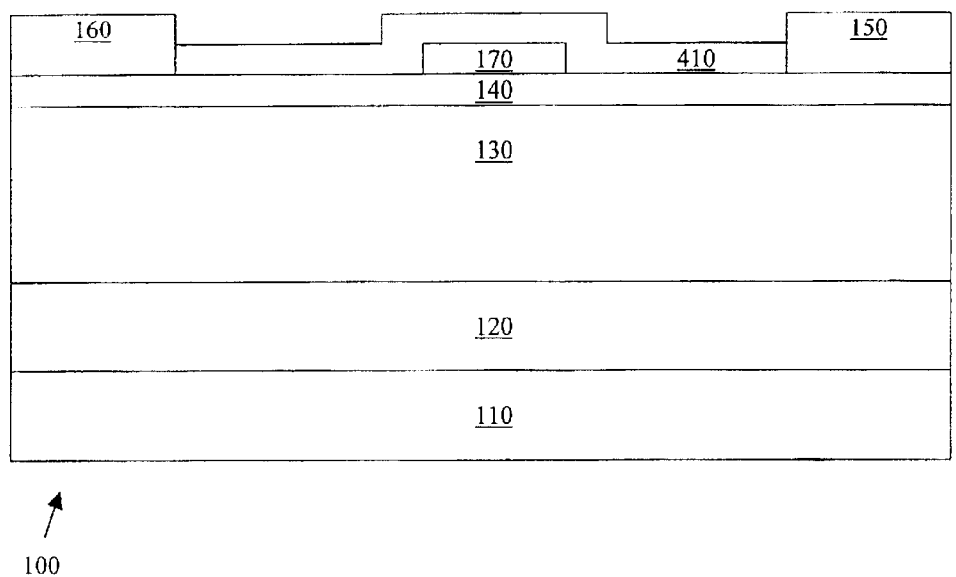
FIG. 5 is a diagrammatic representation of a blocking layer formation operation in an exemplary process of forming the multi-layer structure of FIG. 1.

FIG. 5 illustrates a blocking layer formation operation in which the blocking layers 150 and 160 are formed. In the situation where a MOCVD-grown layer is used for current confinement, blocking layers 150 and 160 are now deposited. Blocking layer 150 and 160 can be deposited using any of a variety of different processes.

The blocking layers 150 and 160 do not develop in the area covered by the hardmask layer 410 and, hence, the blocking layers 150 and 160 exist in a pattern complementary to that of the hardmask layer 410. The blocking layers 150 and 160 may be either n-type material, semi-insulating, composed of alternating PN junction layers, or any other current blocking material type.

Figure 6:
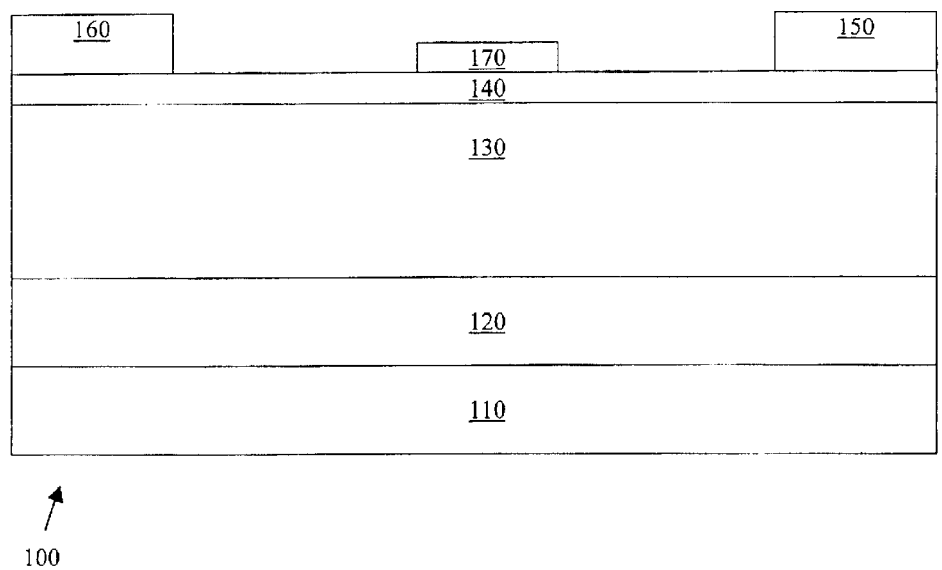
FIG. 6 is a diagrammatic representation of a hardmask removal operation in an exemplary process of forming the multi-layer structure of FIG. 1.

FIG. 6 illustrates a removal operation in which the hardmask layer 410 is removed. When the blocking layers 150 and 160 are deposited, the hardmask layer 410 may be removed with an etchant that removes the material of the hardmask layer 410 at a much higher rate than it removes the material of the high-index guide layer 170, the blocking layers 550 and 560, or the etch stop layer 140.

Figure 7:
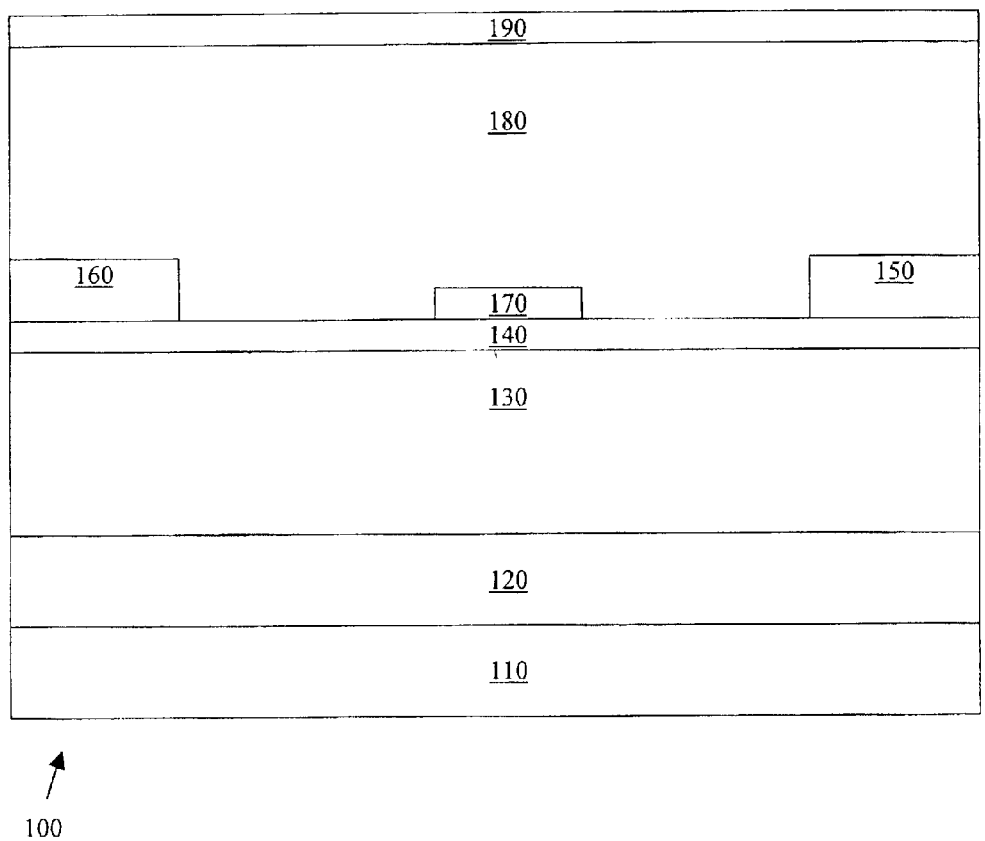
FIG. 7 is a diagrammatic representation of an upper cladding and contact layers formation operation in an exemplary process of forming the multi-layer structure of FIG. 1.

FIG. 7 illustrates a layer formation operation in which the upper cladding layer 180 and the cap layer 190 are formed above the high-index guide layer 170, the blocking layers 150 and 160, or the etch stop layer 140.

The upper cladding layer 180 is provided above both the region which had been covered with the hardmask layer 410 and the blocking layers 150 and 160. The cap layer 190 is preferably a heavily p-doped GaAs layer that is included on the upper surface of the upper cladding layer 180 to form a contact to the metal layer applied in a subsequent operation.

Referring again to FIG. 1, the upper p+ GaAs cap and lower substrate contacts are metalized to form electrodes by which current may be applied across the laser, and the metal layers are annealed in a rapid thermal cycle to insure a local interdiffusion of materials at the GaAs-metal layer boundaries.

Figure 8:
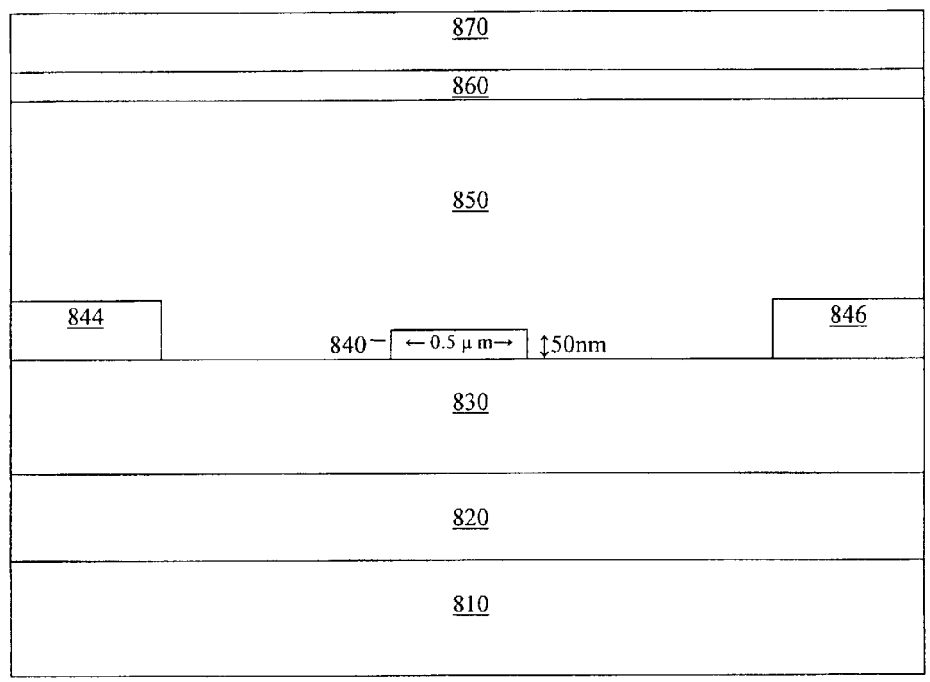
FIG. 8 is a diagrammatic representation of a multi-layer structure of another exemplary device.

Referring now to FIG. 8, in accordance with another exemplary embodiment, a portion 800 of a semiconductor laser device can have various layers. These layers may include a substrate 810, a cladding layer 820, a transverse waveguide 830, a lateral waveguide 840, blocking structures 844 and 846, a cladding layer 850, a P+ contact interface layer 860, and a metal contact layer 870.

The cladding layer 820 and the cladding layer 850 are doped. In at least one embodiment, the cladding layer 820 is an n-doped layer and the cladding layer 850 is a p-doped layer. The P+ contact interface 860 provides an interface between the cladding layer 850 and a metal contact layer 870.

The transverse waveguide 830 provides containment for light in a vertical direction. The lateral waveguide 840 provides containment for light in a horizontal direction. In at least one embodiment, the lateral waveguide 840 includes GaAs and has a thickness of 50 nm and a width of less than 3.0 $\mu$m. Preferably, the lateral waveguide 840 has a width of 0.5 $\mu$m. Advantageously, the narrow width of the lateral waveguide 840 expands the lateral mode size, creating a large modal spot size and ensuring higher-order modes are beyond cutoff. As such, a single mode is provided.

Figure 9:
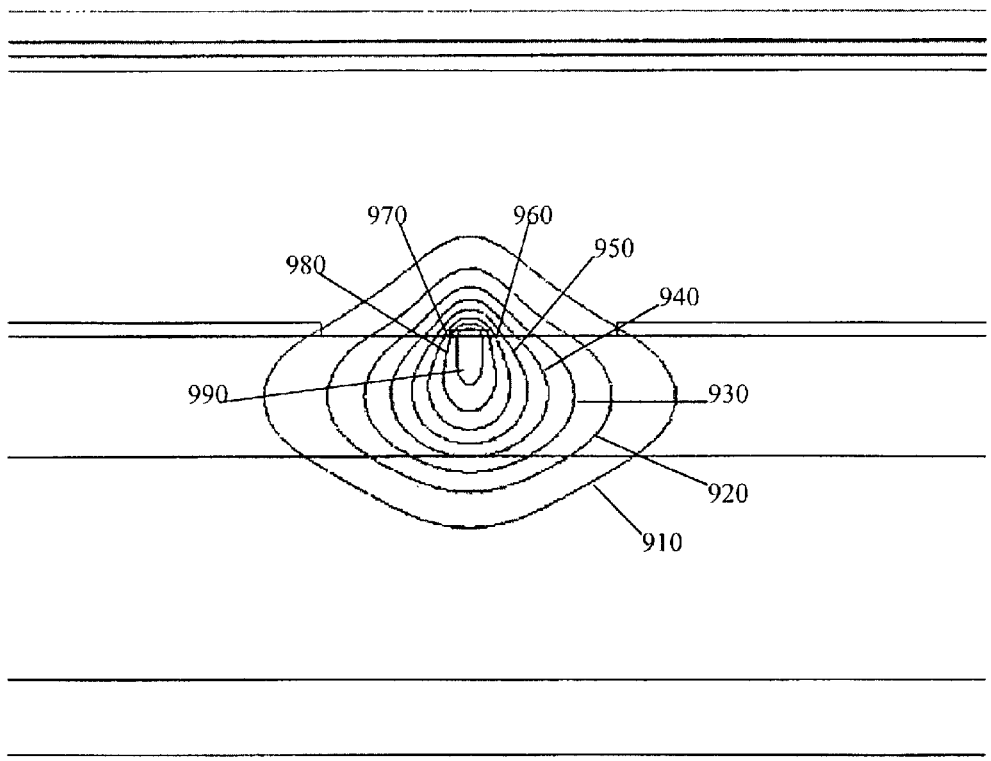
FIG. 9 is a diagrammatic representation of a simulation for the exemplary device of FIG. 8.

A laser diode device including portion 800 with the lateral waveguide 840 exhibits single-mode operation with a large spot-size to high output powers. By way of example, FIG. 9 illustrates a simulation of electrical field intensity in portion 800 described with reference to FIG. 8. Intensity of the electric field in portion 800 is illustrated using contour lines 910–990.

The contour lines 910–990 of FIG. 9 depict intensity levels of the electrical field at every 0.1 units of normalized intensity. The intensity is greatest within the contour line 990 or in the center of the electrical field. The intensity is least outside the contour line 910 or outside the electrical field. The configuration of the contour lines 910–990 demonstrates containment of light around the narrow lateral waveguide 840 described with reference to FIG. 8.

Figure 10:
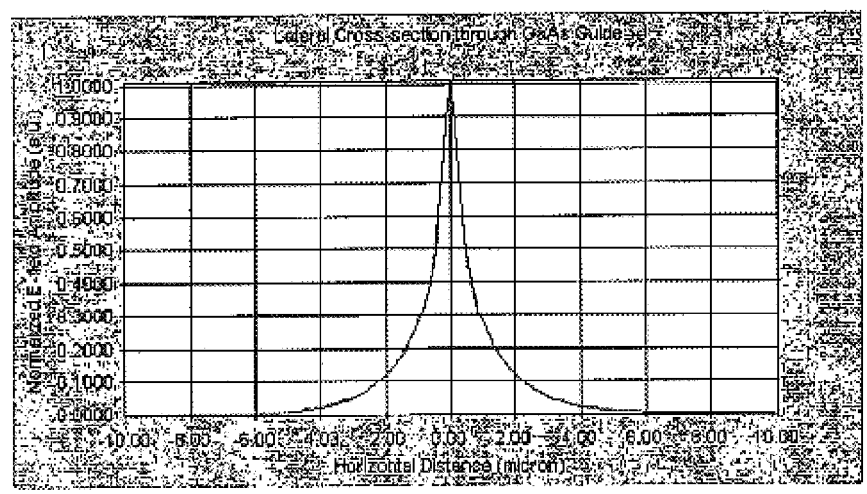
FIG. 10 is a graph depicting the electric field amplitude from a lateral cross-section of the exemplary device of FIG. 8.

FIG. 10 illustrates a graph 1000 of a normalized electric field amplitude over a lateral cross-section through a GaAs guide such as lateral waveguide 840 described with reference to FIG. 8. The graph 1000 plots the electrical field intensity illustrated using the contour lines 910–990 described with reference to FIG. 9. More specifically, the graph 1000 depicts the electrical field intensity in a horizontal direction. The intensity is greatest at the lateral waveguide.

Figure 11:
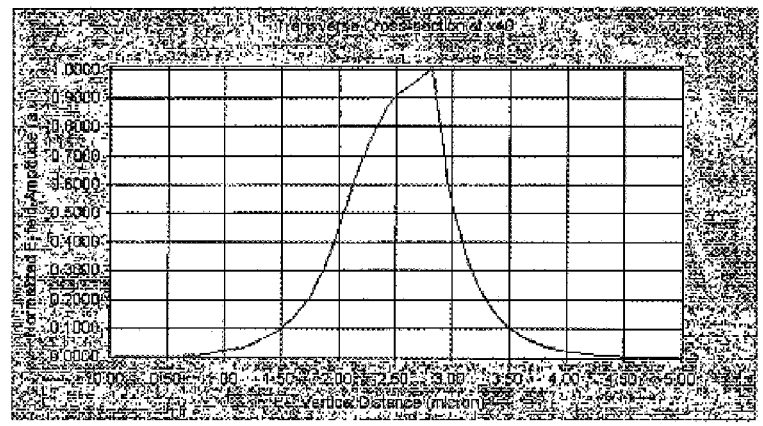
FIG. 11 is a graph depicting the electric field amplitude from a transverse cross-section of the exemplary device of FIG. 8.

FIG. 11 illustrates a graph 1100 of a normalized electric field amplitude over a transverse cross-section. Like the graph 1000 described with reference to FIG. 10, the graph 1100 plots the electrical field intensity illustrated using the contour lines 910–990 described with reference to FIG. 9. The graph 1100 shows the intensity in a vertical direction.

The graph 1100 depicts the electrical field intensity as being greatest just before 3.00 microns from the substrate. For purposes of illustration with the graph 1100, the lateral waveguide 840 described with reference to FIG. 8 can be located at 3.00 microns from the substrate 810. As shown in the graph 1100, electrical field intensity increases through the transverse waveguide 830 (FIG. 8) until a peak is reached at the lateral waveguide 840 (FIG. 8). The electrical field intensity drastically drops in the cladding layer 850.

While the exemplary embodiments illustrated in the figures and described above are presently preferred, it should be understood that these embodiments are offered by way of example only. Other embodiments may include, for example, different techniques for forming the narrow lateral waveguide. The invention is not limited to a particular embodiment, but extends to various modifications, combinations, and permutations that nevertheless fall within the scope and spirit of the appended claims.

What is claimed is:

1. A semiconductor laser comprising:
   at least one quantum well;
   one or more transverse waveguide layers surrounding the at least one quantum well;
   a first cladding layer located below the transverse waveguide layers;
   a lateral guide structure located proximate the transverse waveguide layers, the lateral guide structure having a first index and configured to create a narrow-waveguide mode;
   blocking structures located proximate the lateral guide structure and providing lateral confinement of current to a region surrounding the lateral guide structure; and
   a second cladding layer located above the lateral guide structure, the second cladding layer having a second index, wherein the first index is higher than the second index.

2. The semiconductor laser of claim 1 wherein the lateral guide structure has a thickness of 50 to 300 nm.

3. The semiconductor laser of claim 1 wherein the lateral guide structure has a width of 3.0 $\mu$m or less.

4. The semiconductor laser of claim 1 wherein the blocking structures are located on a common lateral plane as the lateral guide structure.

5. The semiconductor laser of claim 1 wherein the lateral guide structure is doped with a p-type dopant.

6. The semiconductor laser of claim 1 wherein the lateral guide structure has a cross-sectional thickness of less than 250 nm.

7. The semiconductor laser of claim 1 wherein the lateral guide structure includes GaAs.

8. The semiconductor laser of claim 1, wherein blocking structures are made of InGaP, InGaAsP, AlGaAs, GaAs or some combination of these materials.

9. The semiconductor laser of claim 1, wherein blocking structures are formed by means of an implant such as Si, P, Ge, C, or some combination of these materials such that a reverse-biased P-N junction is created.

10. The semiconductor laser of claim 1 wherein blocking structures are formed by means of an implant such as H or Si such that a semi-insulating layer is created.

11. A method of forming a semiconductor laser device, the method comprising:

forming an active layer, one or more transverse waveguide layers, and a first cladding layer above a substrate;

forming a guide layer proximate the active layer;

patterning the guide layer to form a narrow waveguide;

forming blocking structures that provide lateral current confinement to a region surrounding the patterned guide; and forming a second cladding layer above the patterned guide and blocking structures.

12. The method of claim 11 wherein the patterned guide comprises a lateral waveguide including GaAs.

13. The method of claim 11 wherein the patterned guide comprises InGaAsP or AlGaAs.

14. The method of claim 11 wherein the active layer comprises a plurality of quantum wells.

15. The method of claim 11 wherein the blocking structures comprise n-doped InGaP.

16. The method of claim 11 wherein the blocking structures comprise a reverse-biased PN junction formed by implant.

17. The method of claim 11 wherein the blocking structures comprise a semi-insulating region formed by implant.

18. The method of claim 11 wherein the patterned guide has a width of approximately 3.0 $\mu$m or less.

19. An edge-emitting semiconductor laser including a narrow waveguide design, the laser comprising:

a transverse waveguide core including one or more quantum wells;

a lateral waveguide located proximate the transverse waveguide core and being configured to create a narrow-waveguide mode; and blocking structures located proximate the lateral waveguide and configured to confine the current to a region surrounding the lateral waveguide.

20. The laser of claim 19 wherein the lateral waveguide has a width approximately 3.0 $\mu$m or less.

21. The laser of claim 19 wherein the quantum wells comprise InGaAs.

22. The laser of claim 19 wherein the transverse waveguide core comprises a barrier layer.

23. The laser of claim 22 wherein the barrier layers comprise InGaAsP.

24. The laser of claim 19 wherein the blocking structures comprise alternating PN junction layers.

25. The laser of claim 19 wherein the blocking structures comprise semi-insulating layers.

* * * * *